US009818933B2

(12) United States Patent
Wang

(10) Patent No.: US 9,818,933 B2
(45) Date of Patent: Nov. 14, 2017

(54) 6F2 NON-VOLATILE MEMORY BITCELL

(71) Applicant: Intel Corporation, Santa Clara, CA (US)

(72) Inventor: Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/122,093

(22) PCT Filed: Mar. 28, 2014

(86) PCT No.: PCT/US2014/032271
§ 371 (c)(1),
(2) Date: Aug. 26, 2016

(87) PCT Pub. No.: WO2015/147882
PCT Pub. Date: Oct. 1, 2015

(65) Prior Publication Data
US 2017/0069826 A1    Mar. 9, 2017

(51) Int. Cl.
*H01L 27/22* (2006.01)
*H01L 43/02* (2006.01)
(Continued)

(52) U.S. Cl.
CPC .............. *H01L 43/02* (2013.01); *G03F 1/36* (2013.01); *G11C 11/1659* (2013.01);
(Continued)

(58) Field of Classification Search
CPC ......... H01L 43/02; H01L 43/08; H01L 43/10; H01L 43/12; H01L 27/228; G03F 1/36
(Continued)

(56) References Cited

U.S. PATENT DOCUMENTS

| 6,194,278 B1 | 2/2001 | Rengarajan |
| 2008/0037179 A1 | 2/2008 | Ito et al. |

(Continued)

OTHER PUBLICATIONS

Intel Corporation, "Office Action", TW Application No. 104104771, dated Jun. 20, 2016.
(Continued)

*Primary Examiner* — Tu-Tu Ho
(74) *Attorney, Agent, or Firm* — Schwabe Williamson & Wyatt P.C.

(57) ABSTRACT

An apparatus including an array of memory cells arranged in a grid defined by word lines and bit lines in a generally orthogonal orientation relative to one another, a memory cell including a resistive memory component and an access transistor, wherein the access transistor includes a diffusion region disposed at an acute angle relative to an associated word line. A method including etching a substrate to form a plurality of fins each including a body having a length dimension including a plurality of first junction regions and a plurality of second junction regions that are generally parallel to one another and offset by angled channel regions displacing in the length dimension an end of a first junction region from the beginning of a second junction region; removing the spacer material; and introducing a gate electrode on the channel region of each of the plurality of fins.

21 Claims, 10 Drawing Sheets

(51) Int. Cl.
    *G11C 11/16* (2006.01)
    *H01L 43/12* (2006.01)
    *G03F 1/36* (2012.01)
    *H01L 43/08* (2006.01)
    *H01L 43/10* (2006.01)

(52) U.S. Cl.
    CPC ............ *H01L 27/228* (2013.01); *H01L 43/08* (2013.01); *H01L 43/10* (2013.01); *H01L 43/12* (2013.01)

(58) Field of Classification Search
    USPC ........................................................ 257/427
    See application file for complete search history.

(56) References Cited

U.S. PATENT DOCUMENTS

| | | |
|---|---|---|
| 2009/0256220 A1 | 10/2009 | Horng et al. |
| 2010/0240151 A1 | 9/2010 | Belen et al. |
| 2012/0286339 A1* | 11/2012 | Asao ................... H01L 27/228 257/295 |
| 2012/0326218 A1 | 12/2012 | Wang et al. |
| 2013/0107616 A1 | 5/2013 | Ohno et al. |

OTHER PUBLICATIONS

Intel Corporation et al., "International search report and written opinion", PCT/US2014/032271, dated Dec. 16, 2014.
Intel Corporation, "International Preliminary Report on Patentability", PCT/US2014/032271, dated Oct. 13, 2016.
Intel Corporation, "Second office action", TW Application No. 104104771, dated Sep. 12, 2016.

* cited by examiner

6F2 NON-VOLATILE MEMORY BITCELL

CROSS-REFERENCE TO RELATED APPLICATION

This patent application is a U.S. National Phase Application under 35 U.S.C. §371 of International Application No. PCT/US2014/032271, filed Mar. 28, 2014, entitled 6F$^2$ NON-VOLATILE MEMORY BITCELL.

BACKGROUND

Field

Non-volatile memory.

Description of Related Art

Magnetoresistive RAM (MRAM) is a type of non-volatile memory that stores data in the form of magnetic storage element. The magnetic storage elements are formed typically of a magnetic tunnel junction (MTJ) which is a component of two ferromagnets separated by a thin insulating layer. One of the two ferromagnets is a permanent magnet set to a particular polarity. The magnetic field of the other ferromagnet can be changed to match that of an external field to store memory. Representatively, a cell containing such magnetic storage element may be selected by powering an associated transistor that switch its current from a supply line through the cell to ground. Due to a magnetic tunnel effect, an electrical resistance of the cell changes due to the orientation of the field in the two ferromagnets. By measuring a resulting current, a resistance inside of a particular cell can be determined (the cell can be read). Data is written to the cells representatively by inducing a magnetic field at a junction which is seen in the writable plate.

Spin transfer torque (STT) MRAM uses spin-aligned electrons to influence electrons flowing into a layer to change their spin. Where a current is passed through a magnetization layer (the fixed magnetic layer) the current will come out spin polarized. With the passing of each electron, its spin (angular momentum) will be transferred to the magnetization in the next magnetic layer, called the free magnetic layer, and will cause a small change on its magnetization. This is, in effect, a torque-causing precession of magnetization. Due to reflection of electrons, a torque is also exerted on the magnetization of an associated fixed magnetic layer. In the end, if the current exceeds a certain critical value (given by damping caused by the magnetic material and its environment), the magnetization of the free magnetic layer will be switched by a pulse of current, typically in about one to 10 nanoseconds. Magnetization of the fixed magnetic layer may remain unchanged since an associated current is below its threshold due to geometry or due to an adjacent anti-ferromagnetic layer.

Spin-transfer torque can be used to flip the magnetic storage elements in magnetic random access memory. Spin-transfer torque MRAM, or STT-MRAM, has the advantages of lower power consumption and better scalability over conventional magnetic random access memory (MRAM) which uses magnetic fields to flip the active elements. However, significant improvements are still needed in the area of STT-MRAM device manufacture and usage.

DETAILED DESCRIPTION

In one embodiment, layout architecture and technology features for a 6F$^2$ non-volatile memory bit cell is described. In one embodiment, an apparatus includes an array of memory cells arranged in a grid defined by word lines and bit lines arranged in a generally orthogonal orientation relative to one another. A cell of the array of memory cell includes a non-volatile memory component and an access transistor. The access transistor includes a diffusion region that is disposed at an acute angle relative to an associated word line. A method of forming an apparatus and an architecture for a 6F$^2$ non-volatile memory bit cell is also disclosed (an integrated circuit substrate comprising an array of memory cells having an effective size of 6F$^2$).

Figure 1:
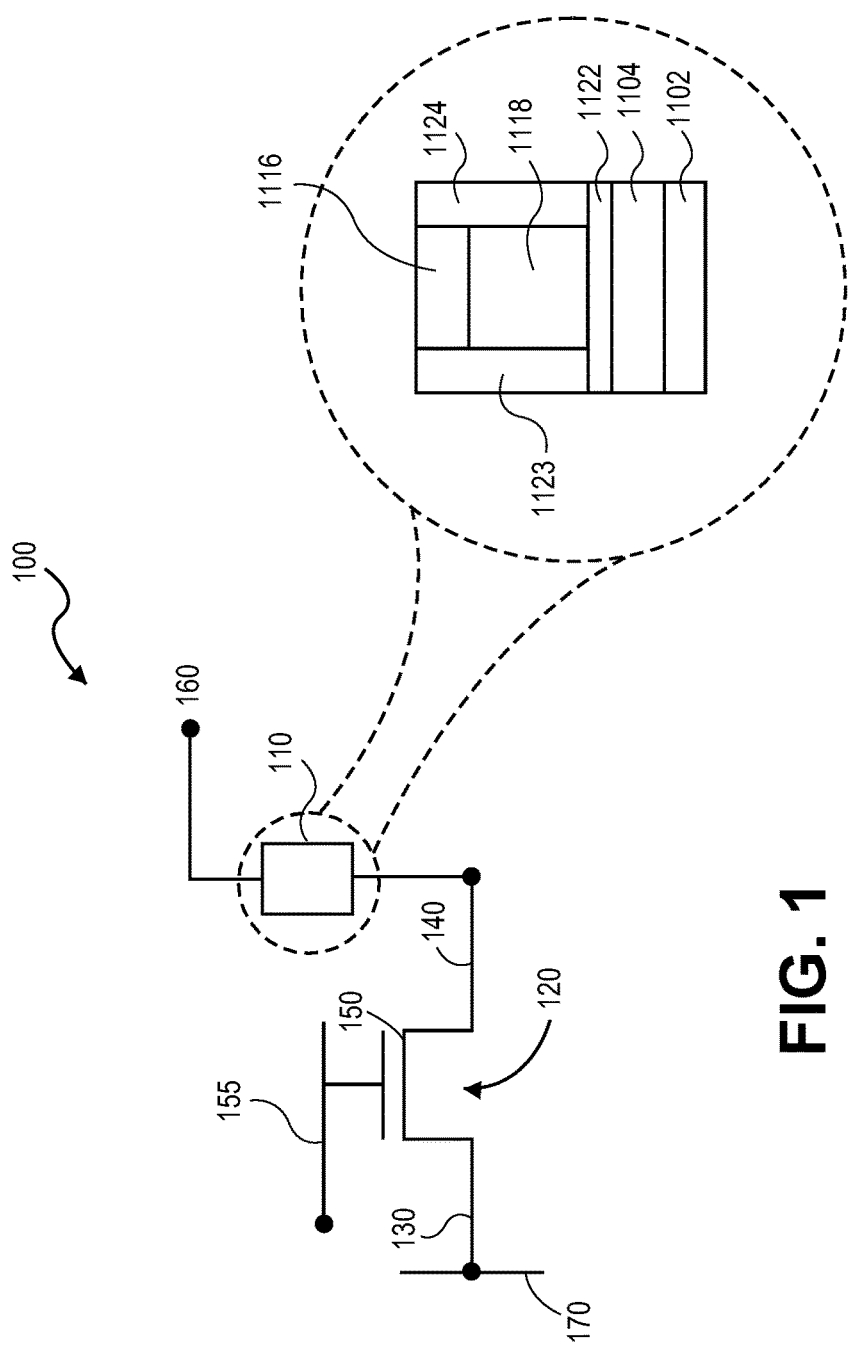
FIG. 1 illustrates a schematic of a STT-MRAM memory bit cell.

FIG. 1 illustrates a schematic of a non-volatile memory bit cell that is an STT-MRAM memory bit cell. Bit cell 100 includes STT-MRAM memory element or component 110. As shown in the inset, where STT-MRAM memory component 110 is a spin transfer torque element, such element representatively includes bottom electrode 1102 of, for example, ruthenium with fixed magnetic layer 1104 of, for example, cobalt-iron-boron (CoFeB) adjacent bottom electrode 1102; top electrode 1116 of, for example, tantalum adjacent free magnetic layer 1118 of, for example, CoFeB; and tunneling barrier or dielectric layer 1122 of, for example, magnesium oxide (MgO) disposed between fixed magnetic layer 1104 and free magnetic layer 1118. In an embodiment, a spin transfer torque element is based on perpendicular magnetism. Finally, first dielectric element 1123 and second dielectric element 1124 may be formed adjacent to top electrode 1116, free magnetic layer 1118 and tunneling barrier dielectric layer 1122.

STT-MRAM memory component 110 is connected to bit line 160. Top electrode 1116 may be electrically connected to bit line 160. STT-MRAM memory component 110 is also connected to access transistor 120 associated with bit cell 100. Access transistor 120 includes a diffusion region including junction region 130 (source region), junction region 140 (drain region), a channel region between or separating the junction regions and gate electrode 150 on the channel region. As illustrated, STT-MRAM memory component 110 is connected to junction region 140 of access transistor 120. Bottom electrode 1102 is connected to the junction region. Junction region 130 in bit cell 100 is connected to source line 170. Finally, gate electrode 150 is electrically connected to word line 155.

Figure 2:
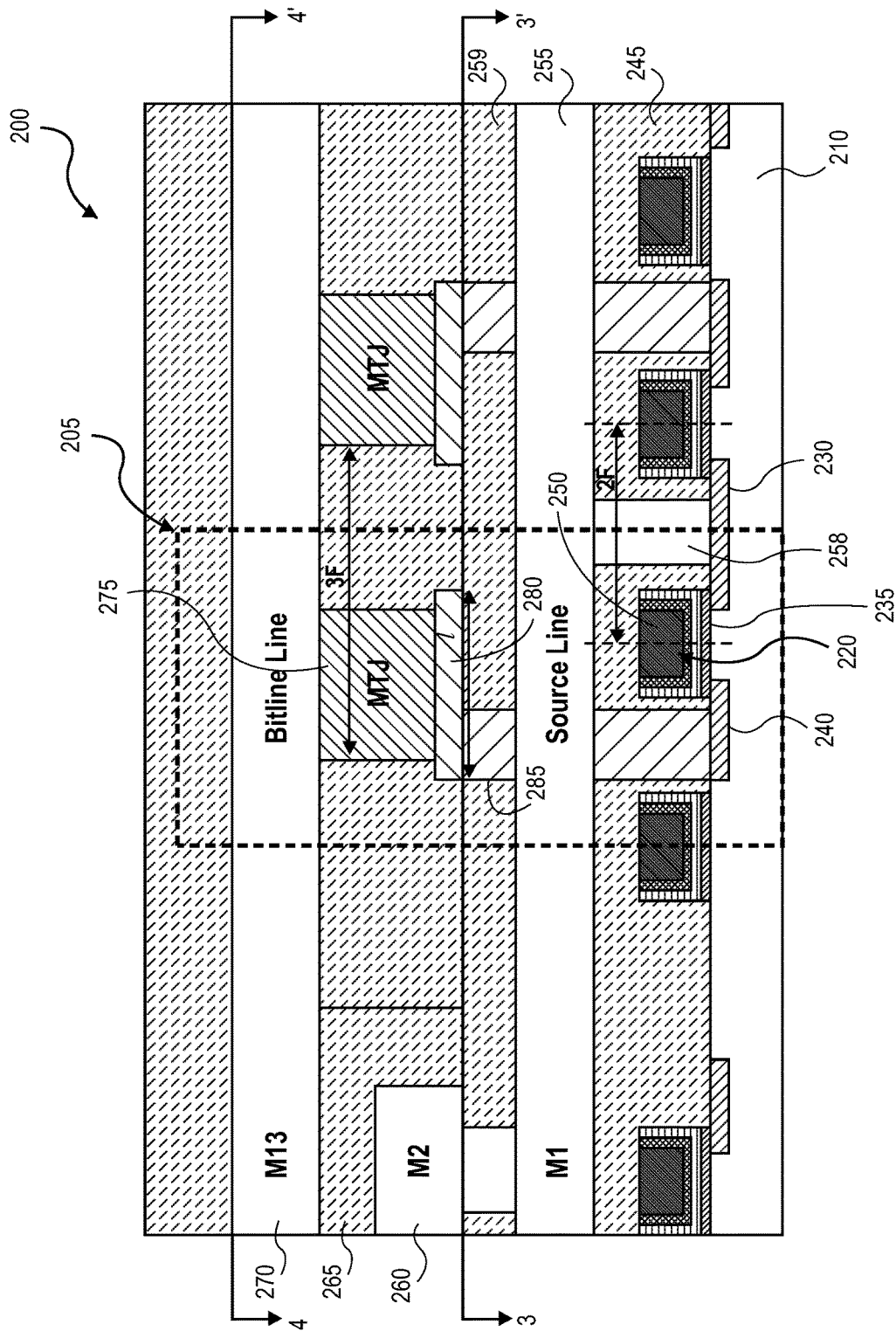
FIG. 2 shows a cross-sectional side view of a portion of an integrated circuit substrate including a number of STT-MRAM memory bit cells.

FIG. 2 shows a cross-sectional side view of a portion of an integrated circuit substrate including a number of STT-MRAM memory bit cells. In one embodiment, the integrated circuit structure is a memory device built of a grid of STT-MRAM memory cells. Referring to FIG. 2, structure 200 includes substrate 210 of, for example, a single crystal semiconductor material such as silicon. Substrate 210 has a number of devices formed thereon including transistor devices represented by transistor 220. Such transistors may be, for example, a single gate or multi-gate device or both. As illustrated, transistor 220 includes a diffusion region including junction region 230 (source region) and junction region 240 (drain region) and channel region 235 between the junction regions. Transistor 220 also includes gate electrode 250 of, for example, a polysilicon material or metal material.

Overlying the devices (e.g., transistor 220) on substrate 210 in FIG. 2 is interlayer dielectric 245. On interlayer dielectric 245 is patterned metal line (M1) that, in this embodiment, is source line 255. As shown, disposed between source line 255 and junction region 230 is conductive via 258. Representatively, conductive via 258 is, for example, tungsten and source line 255 is, for example, copper. In one embodiment, conductive via 258 and source line 255 may be formed, for example, by a Damascene technique.

FIG. 2 also shows interlayer dielectric 259 overlying the first metal line (source line 255) and patterned second metal line 260 formed on a surface of interlayer dielectric 259. FIG. 2 also shows pillar contact 285 extending through interlayer dielectric 259 and interlayer dielectric 245 to junction region 240 of transistor 220. In one embodiment, pillar contact 285 is a conductive material, such as copper or tungsten that is disposed in dielectric material (interlayer dielectric 245 and interlayer dielectric 259) and does not come in contact with the first metal layer (source line 255). Representatively, pillar contact 285 is self-aligned to source line 255. Representatively, pillar contact 285 and second metal line 260 are formed by a Damascene technique.

Also disposed on a surface of interlayer dielectric 259 at a second metal line layer in structure 200 is redistribution layer 280. In one embodiment, redistribution layer 280 has an area defined by length, l, and width into and out of the page. The area of redistribution layer 280 is greater than a cross-sectional area through an end of pillar contact 285. As illustrated, an end of pillar contact 285 contacts an area of a base of redistribution layer 280 while an opposite end contacts junction region 240 of access transistor 220. Connected to an opposite side of redistribution layer 280 is STT-MRAM memory element 275. In one embodiment, STT-MRAM memory element 275 is a magneto-tunnel-junction (MTJ) memory device within an STT-MRAM bit cell. Overlying STT-MRAM memory component 275 is a third layer of metal including bit line 270 of, for example, copper.

As illustrated in FIG. 2, STT-MRAM memory component 275 contacts redistribution layer 280 in an area offset from an area where pillar contact 285 contacts an opposite side of redistribution layer 280. In other words, pillar contact 285 and STT-MRAM memory element 275 are not axially aligned. By offsetting STT-MRAM memory component 275 on redistribution layer 280 relative to pillar contact 285, STT-MRAM memory component 275 can be placed at a lateral center of bit cell 205 (illustrated in dashed lines with the lateral dimension being the bit line direction (left to right as viewed)). Placing STT-MRAM memory component 275 in the center of bit cell 205 increases a space between adjacent STT-MRAM memory components in the bit line direction. FIG. 2 illustrates the pitch of STT-MRAM memory component 275 in a bit line direction. FIG. 2 shows a pitch of 3F with F defined as the distance of one half the width of pillar contact 285 to the center of gate electrode 250. By placing the STT-MRAM memory component in the center of bit cell 205, a 3F pitch of the STT-MRAM memory component in the bit line direction is enabled.

In one embodiment, in addition to allowing the redistribution of the STT-MRAM memory component 275 to, for example, a center of bit cell 205, redistribution layer 280 is selected to be a material having a smoother surface than pillar contact 285 and a surface of interlayer dielectric 259. For an MTJ memory component, a tunnel magneto resistance (TMR) ratio of, for example, magnesium oxide is sensitive to the surface roughness of an underlying layer. In one embodiment, an area of redistribution layer 280 is large enough to accommodate a memory component on a surface thereof. Without redistribution layer 280, memory component 275 would be placed on two different materials: an end of pillar contact 285 and interlayer dielectric material around the pillar contact. Providing one surface for contact with memory component 275, in one embodiment, redistribution layer 280 is selected of a material such as a tantalum material that has a surface with a reduced surface roughness compared to an end of pillar contact 285 and interlayer dielectric. Thus, by selecting a material such as tantalum for redistribution layer 280, redistribution layer 280 serves as a buffer between STT-MRAM memory component 275 and pillar contact 285.

Figure 3:
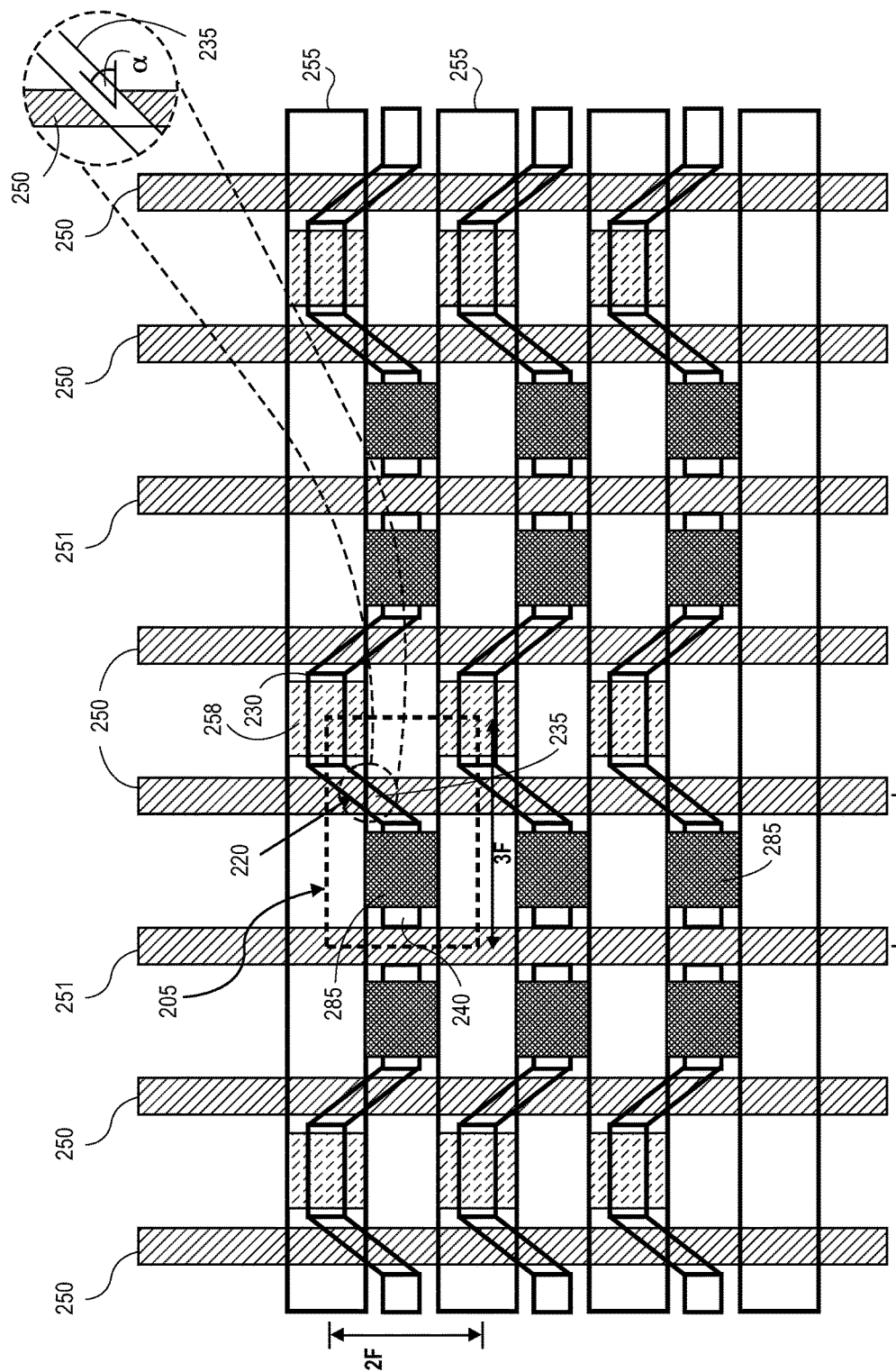
FIG. 3 is a top plan view of a memory cell array through line 3-3' of FIG. 2.

FIG. 3 is a top plan view of a memory cell array through line 3-3' of FIG. 2. In this embodiment, the array is arranged in a grid defined by word lines and source lines arranged in a generally orthogonal orientation relative to one another. Referring to bit cell 205, the cell includes access transistor 220. Access transistor 220 includes a diffusion region including junction region 230 and junction region 240. As illustrated, junction region 230 is positioned from this plan view underneath source line 255 such that source line contact 258 is disposed between source line 255 and junction region 230 underneath (below) source line 255 as viewed. Junction region 240 is disposed between adjacent source lines. FIG. 3 also shows pillar contact 285 disposed between adjacent source lines. As illustrated, the diffusion region of access transistor 220 also includes channel region 235 between junction region 230 and junction region 240. FIG. 3 shows word line 250 (e.g., the gate of access transistor 220) disposed on channel region 235. As illustrated, channel region 235 is disposed at an acute angle relative to word line 250. An inset shows channel region 235 disposed at acute angle, α, of, for example, 40 to 80 degrees relative to a direction of word line 250. The angled channel region of access transistor 220 tilts the position of the diffusion region to create a wave-like diffusion layout through the array. Stated another way, the diffusion region has a length dimension extending in a lateral direction (left to right as viewed) and including junction region 240 and junction region 230. The angled channel region displaces an end of junction region 240 from the beginning of junction region 230 in the lateral direction. FIG. 3 also shows the offset junction regions are generally parallel to one another in a length dimension. The tilted diffusion allows the source and drain junctions of access transistor 220 to connect to source line contact 258 and pillar contact 285 within a 2F source line pitch, where F is half of the metal one pitch. FIG. 3 further shows inactive or dummy word lines 251 formed in the array in areas in the array where pillar contacts are adjacent one another rather than spaced by a source line contact therebetween.

Figure 4:
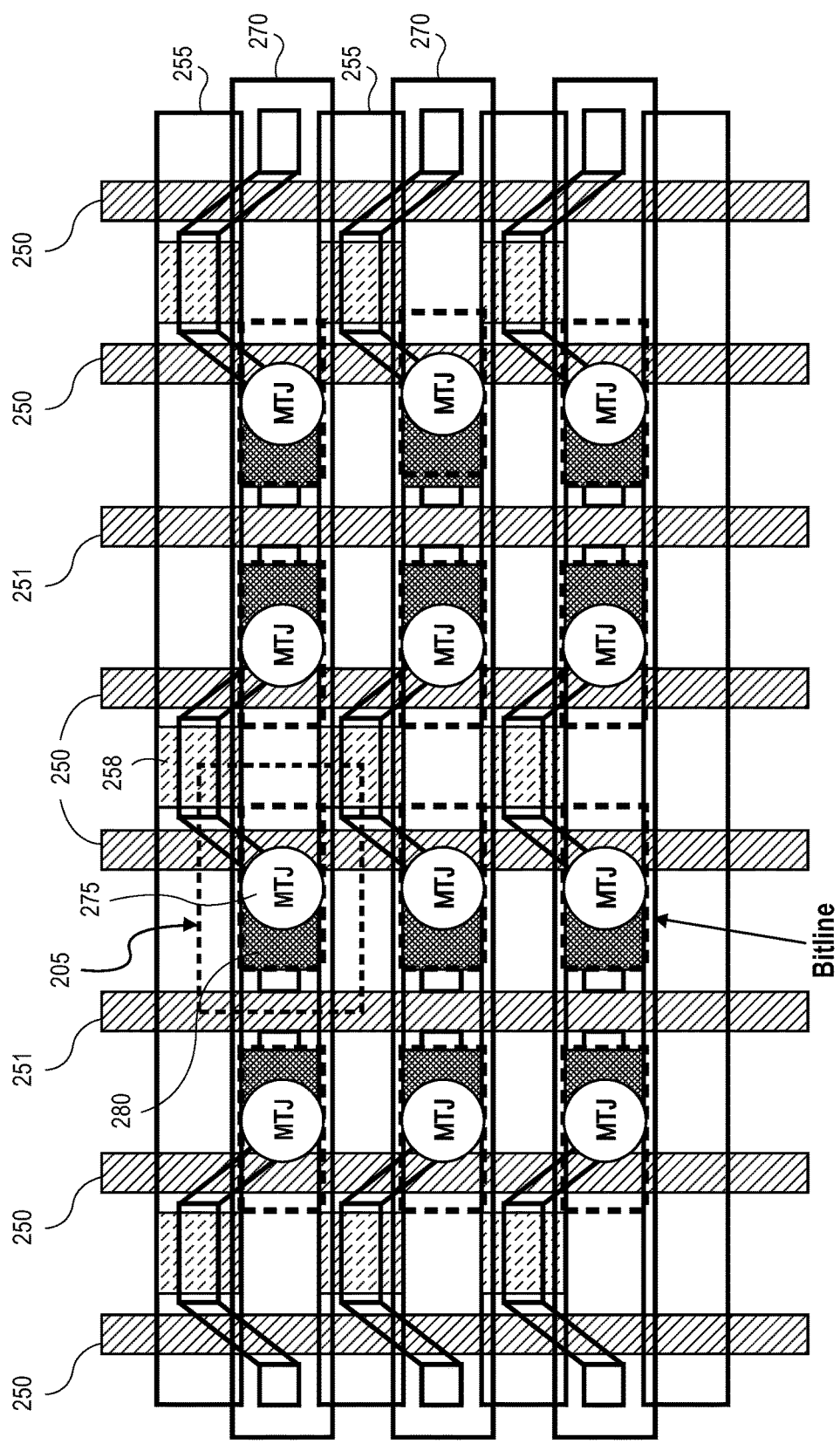
FIG. 4 shows a top plan view of a STT-MRAM memory cell array through line 4-4' of FIG. 2.

FIG. 4 shows a top plan view of a STT-MRAM memory cell array through line 4-4' of FIG. 2. FIG. 4 shows redistribution layer 280 formed on pillar contact 285 (not shown) and STT-MRAM memory component 275 connected to redistribution layer 280 and offset from a contact position of pillar contact 285 on an opposite side of redistribution layer 280 (to the right) as viewed. FIG. 4 shows STT-MRAM memory component 275 centered in bit cell 205. FIG. 4 also shows bit line 270 connected to STT-MRAM memory component 275. FIG. 4 illustrates that the shifting of STT-MRAM memory component 275 to an appropriate center of the bit cell through the use of redistribution layer. The centering of STT-MRAM memory component allows uniform spacing of memory component such that bit line 270, source line 255 and memory component are on the same 2F pitch in a word line direction.

Figure 5:
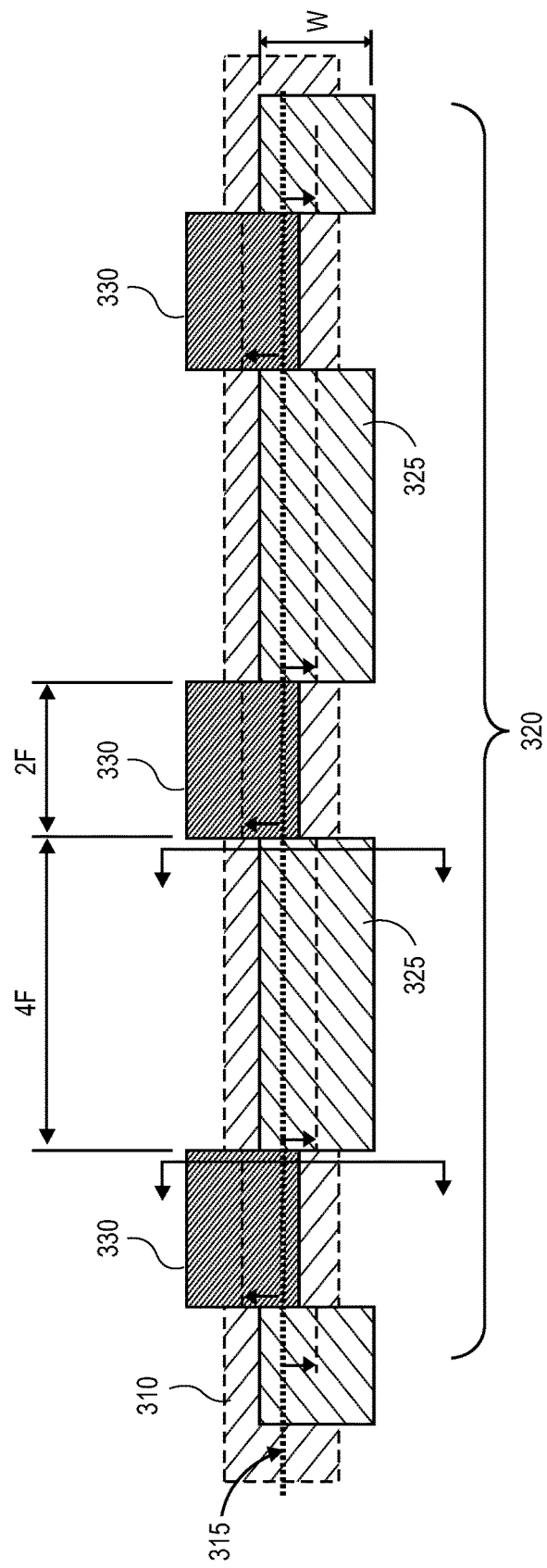
FIG. 5 shows a top plan view of an assembly of patterned feature sub-units arranged on a substrate in a wave-like pattern.
Figure 6:
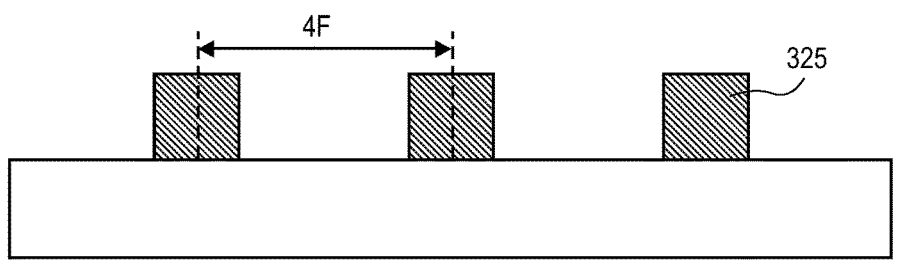
FIG. 6 shows a cross-sectional side view of the structure of FIG. 5 and shows a first group of patterned feature sub-units on a substrate.
Figure 7:
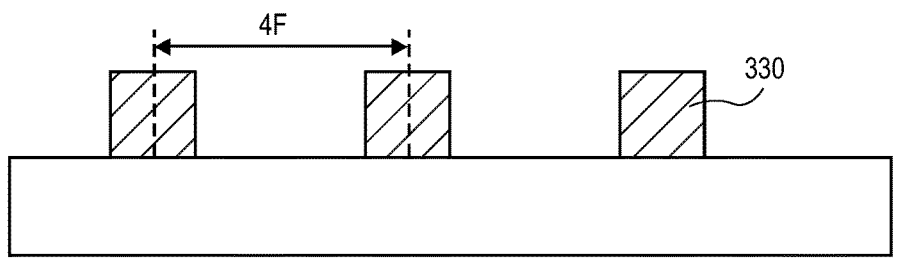
FIG. 7 shows a cross-sectional side view of the structure of FIG. 5 and shows a second group of patterned feature sub-units on the substrate.

In the illustration presented in FIG. 3 and FIG. 4, the access transistor has a wave-like diffusion layout. FIGS. 5-15 describe an approach to implement a wave-like diffusion layout in a $6F^2$ cell. The method described is for a multi-gate transistor device having a fin diffusion. Typically, in a logic area of an integrated circuit structure, a patterned feature is used to form spacers or hard masks for use in defining transistor fin diffusion regions in a logic area. The patterned feature typically has a long rectangular shape and the spacers are formed on opposite sidewalls thereof. In order to form a wave-like diffusion layout in an array of memory cells, such patterned feature is modified. FIG. 5 shows a top plan view of an assembly of patterned feature sub-units arranged on a substrate in a wave-like pattern. The sub-units share a common width dimension, ω, as would be used for a patterned feature for use in defining a transistor fin in a logic area (feature 310). The pattern includes two groups of rectangular sub-units, sub-units 325 and sub-units 330 arranged on a substrate. The patterned feature sub-units are placed with an offset with respect to a center line of a linear patterned feature that might be used in a logic area (feature 310). As illustrated in FIG. 5, patterned feature sub-units 325 are positioned with a predominate portion of each sub-unit below center line 315 of feature 310 while patterned feature sub-units 330 are positioned with a predominate portion of each sub-unit above the center line 315. The jogs between patterned feature sub-units 325 and patterned feature sub-units 330 create a repeating wave-like pattern in a patterned feature defined by the assembly of sub-units. The jog defines the tilted fin diffusion of an access transistor. A size of a diffusion jog in a layout defines a curvature of a fin diffusion region and can be optimized to achieve $6F^2$ cell layout. FIG. 5 shows a length of patterned feature sub-units 325 is equivalent to 4F while a length of patterned feature sub-units 330 is equivalent to 2F. FIG. 6 shows a cross-sectional side view of the structure of FIG. 5 and shows patterned feature sub-units 325 on a substrate. FIG. 7 shows a cross-sectional side view of the structure of FIG. 5 and shows patterned feature sub-units 330 on the substrate.

Figure 8:
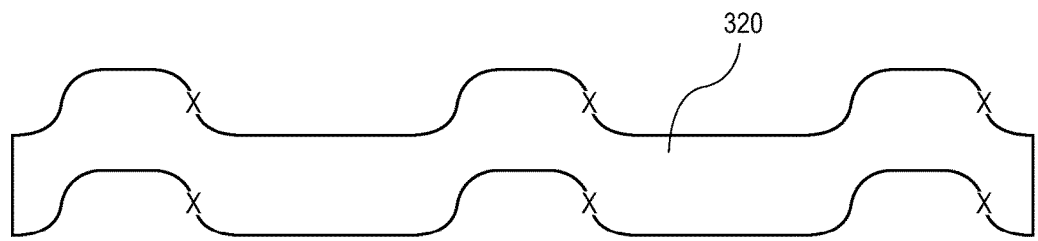
FIG. 8 shows a top view of the patterned feature illustrated in FIG. 5 after optical proximity correction.
Figure 9:
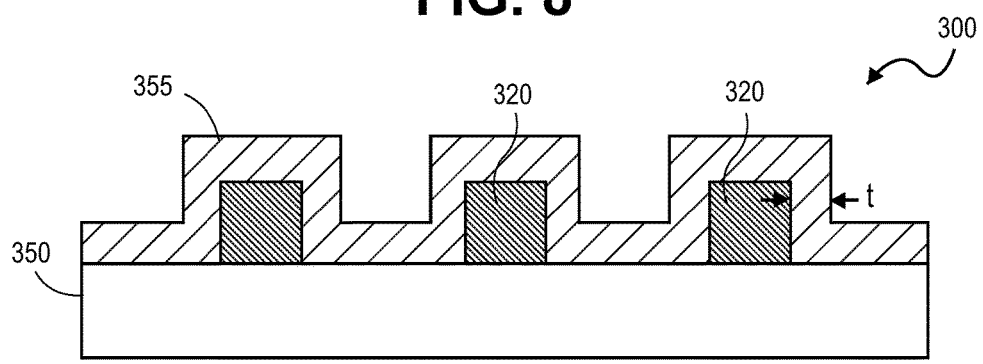
FIG. 9 shows a cross-sectional side view of a semiconductor substrate having a number of patterned features placed on a surface of a substrate and a dielectric layer conformally overlying the patterned features.

Optical proximity correction (OPC) is a photolithography enhancement technique that can be used to compensate for image errors due to diffraction of process effects. FIG. 8 shows a top view of an embodiment of the patterned feature illustrated in FIG. 5 after OPC. The sharp edges separating the patterned feature sub-units 325 and patterned feature sub-units 330 in FIG. 5 are removed. Patterned feature 320 has a wave-like pattern that can be used to transfer a similar pattern to a semiconductor substrate to form the desired wave-like diffusion fin. FIGS. 9-15 describe the formation of such fin. FIG. 9 shows a cross-sectional side view of a semiconductor substrate having a number of patterned features place on a surface of a substrate and a dielectric layer conformally overlying the patterned features. FIG. 9 shows substrate 350 of, for example, single crystal silicon. On the surface thereof are patterned features 320 of, for example, photoresist, silicon or carbon. Overlying patterned features 320 is a hard mask material 355. In one embodiment, hard mask material 355 is, for example, silicon nitride deposited by chemical vapor deposition (CVD) in a conformal fashion. A thickness of dielectric layer 355 is selected, in one embodiment, for a thickness, t, of a diffusion region of an access transistor. A representative thickness is on the order of 10 nanometers (nm) to 20 nm.

Figure 10:
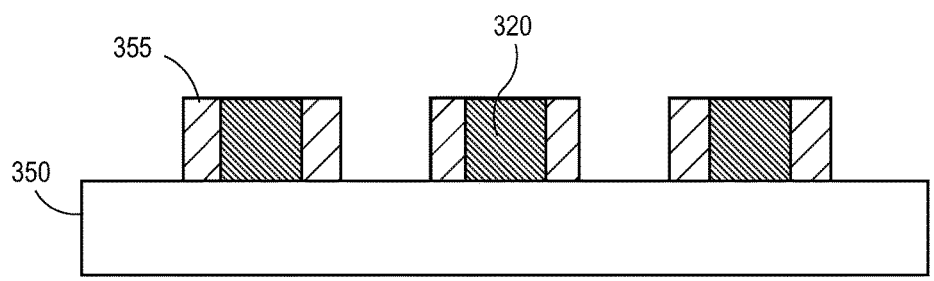
FIG. 10 shows the structure of FIG. 9 following an anisotropic etch of the dielectric layer.

FIG. 10 shows the structure of FIG. 9 following an anisotropic etch of dielectric layer 355. As illustrated, anisotropic etch removes the laterally disposed dielectric material (as viewed) and in doing so exposes patterned features 320.

Figure 11:
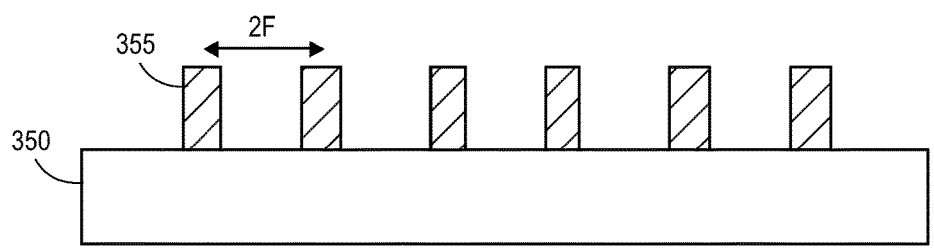
FIG. 11 shows the structure of FIG. 10 following the removal of the patterned features.

FIG. 11 shows the structure of FIG. 10 following the removal of patterned features 320. In an embodiment where patterned features 320 are photoresist, patterned features 320 may be removed by oxygen ashing. The removal of patterned features 320 leaves dielectric material 355 on substrate 350. In one embodiment, the dielectric layers have a pitch of 2F.

Figure 12:
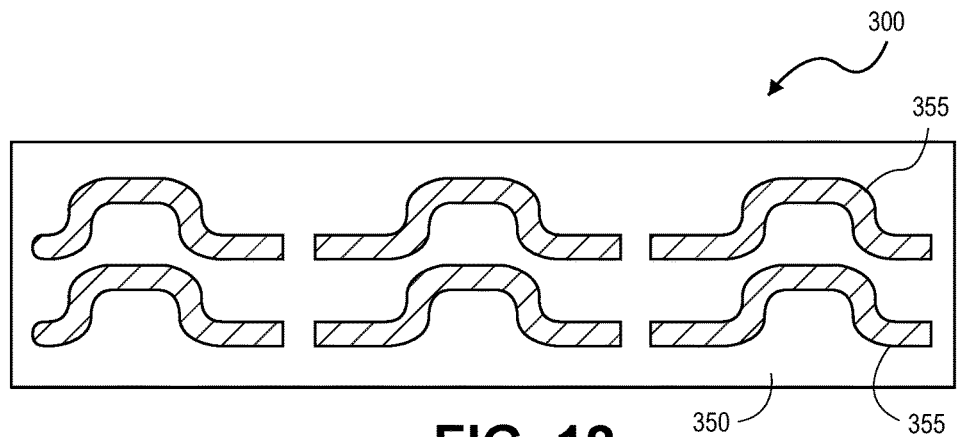
FIG. 12 shows a top view of the structure of FIG. 11 and illustrates two of the dielectric material spacers on substrate.

FIG. 12 shows a top view of the structure of FIG. 11 and illustrates two of the dielectric material spacers on substrate 350. As illustrated, the spacers of dielectric material 355 have the contour of the patterned feature to which the spacers previously conformed. FIG. 12 also shows the structure following the formation of openings defining separations between sections of each spacer structure where, for example, dummy word lines might pass in a memory array (see FIGS. 3-4). The spacers in FIG. 12 are cut vertically using a spacer trim mask. The spacer trim mask has equally spaced vertical lines defining where the spacers will be trimmed. In one embodiment, the spacers are separated by opening formed between two adjacent pillar contacts (see FIG. 3). A pitch of vertical lines is 6F and the width of each vertical line is on the order of tens of nanometer.

Figure 13:
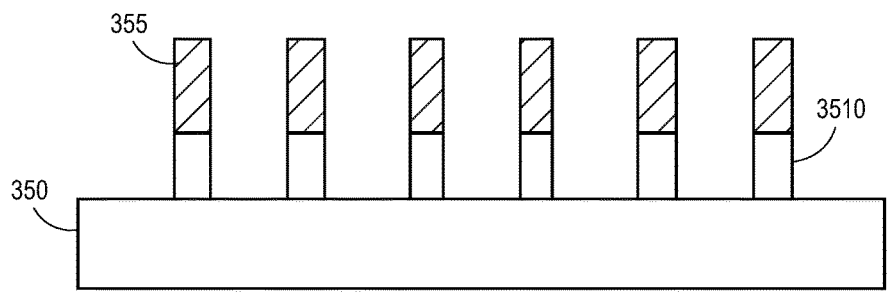
FIG. 13 shows the structure of FIG. 12 following the patterning of a substrate to form the fin structures.

FIG. 13 shows the structure of FIG. 12 following the patterning of substrate 350 to form fin structures. In one embodiment, spacers of dielectric material 355 are used as mask to define a width of a fin and the semiconductor material is etched with, for example, a $CF_3$ etchant to a desired fin thickness.

Figure 14:
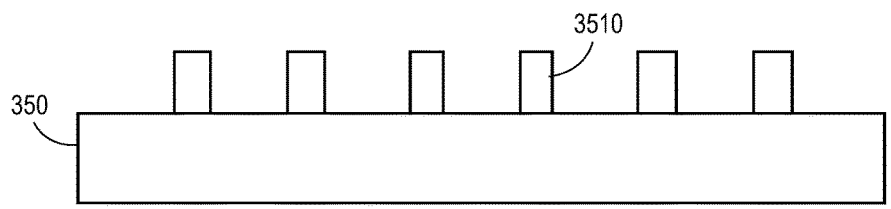
FIG. 14 shows the structure of FIG. 13 following the removal of the dielectric material.

FIG. 14 shows the structure of FIG. 13 following the removal of the dielectric material. In one embodiment, the dielectric material may be removed by etching. FIG. 14 shows substrate 350 including fin structures 3510 on the substrate. Fin structures 3510 have a pitch of 2F.

Figure 15:
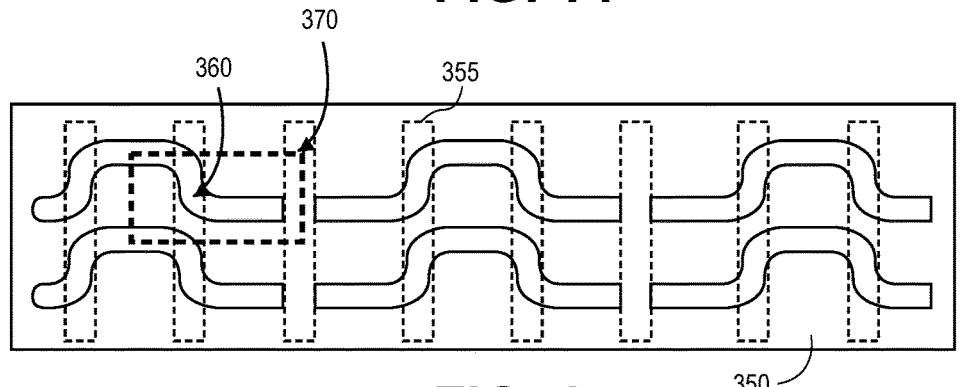
FIG. 15 shows a top view of the structure of FIG. 14 and shows the adjacent fin structures having the contour of the patterned features from which they are formed.

FIG. 15 shows a top view of the structure of FIG. 14 and shows adjacent fin structures having the contour of the patterned features from which they are formed. FIG. 15 also representatively shows locations of word lines (word lines 355 illustrated in dashed lines), representative memory bit cell 370 and a position of access transistor 360. Having formed the fin diffusion features as described, the process described with reference to FIG. 2 may be used to form the $6F^2$ memory cell array as described, for example, with respect to FIGS. 3 and 4.

Figure 16:
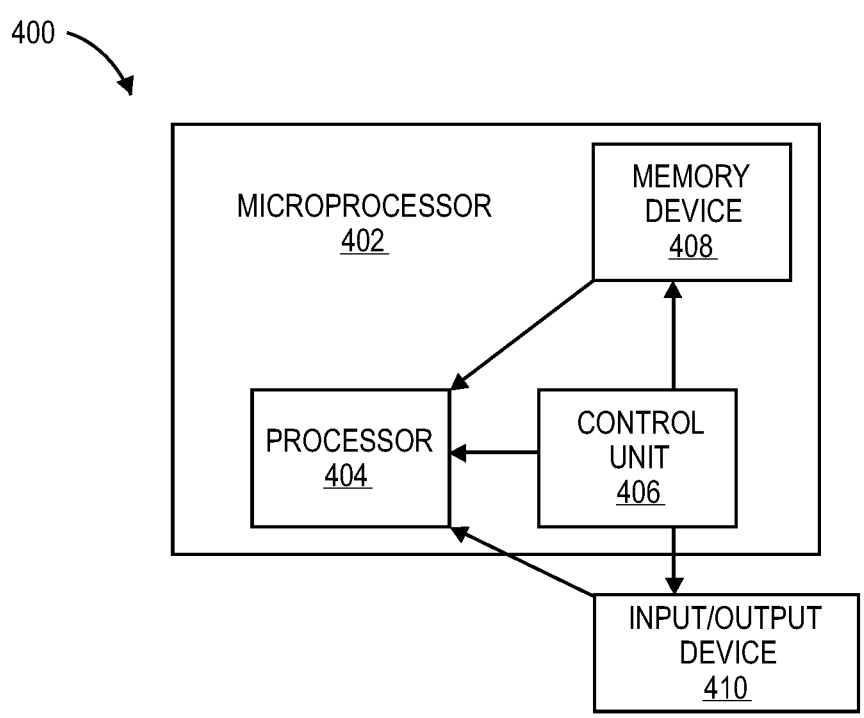
FIG. 16 illustrates a block diagram of an embodiment of an electronic system.

FIG. 16 illustrates a block diagram of an embodiment of electronic system 400. Electronic system 400 can correspond to, for example, a portable system, a computer system, a process control system, or any other system that utilizes a processor and an associated memory. In this embodiment, electronic system 400 includes microprocessor 402 (having processor 404 and control unit 406), memory device 408, and input/output device 410 (it is to be understood that electronic system 400 may have a plurality of processors, control units, memory device units and/or input/output devices in various embodiments). In one embodiment, electronic system 400 has a set of instructions that defines operations which are to be performed on data by processor 404, as well as, other transactions between processor 404, memory device 408, and input/output device 410. Control unit 406 coordinates the operations of processor 404, memory device 408 and input/output device 410 by cycling through a set of operations that cause instructions to be retrieved from memory device 408 and executed. Memory device 408 can include element such as a spin transfer torque MRAM element as described herein, or other types of volatile and non-volatile memory components. In an embodiment, memory device 408 is embedded in microprocessor 402.

Figure 17:
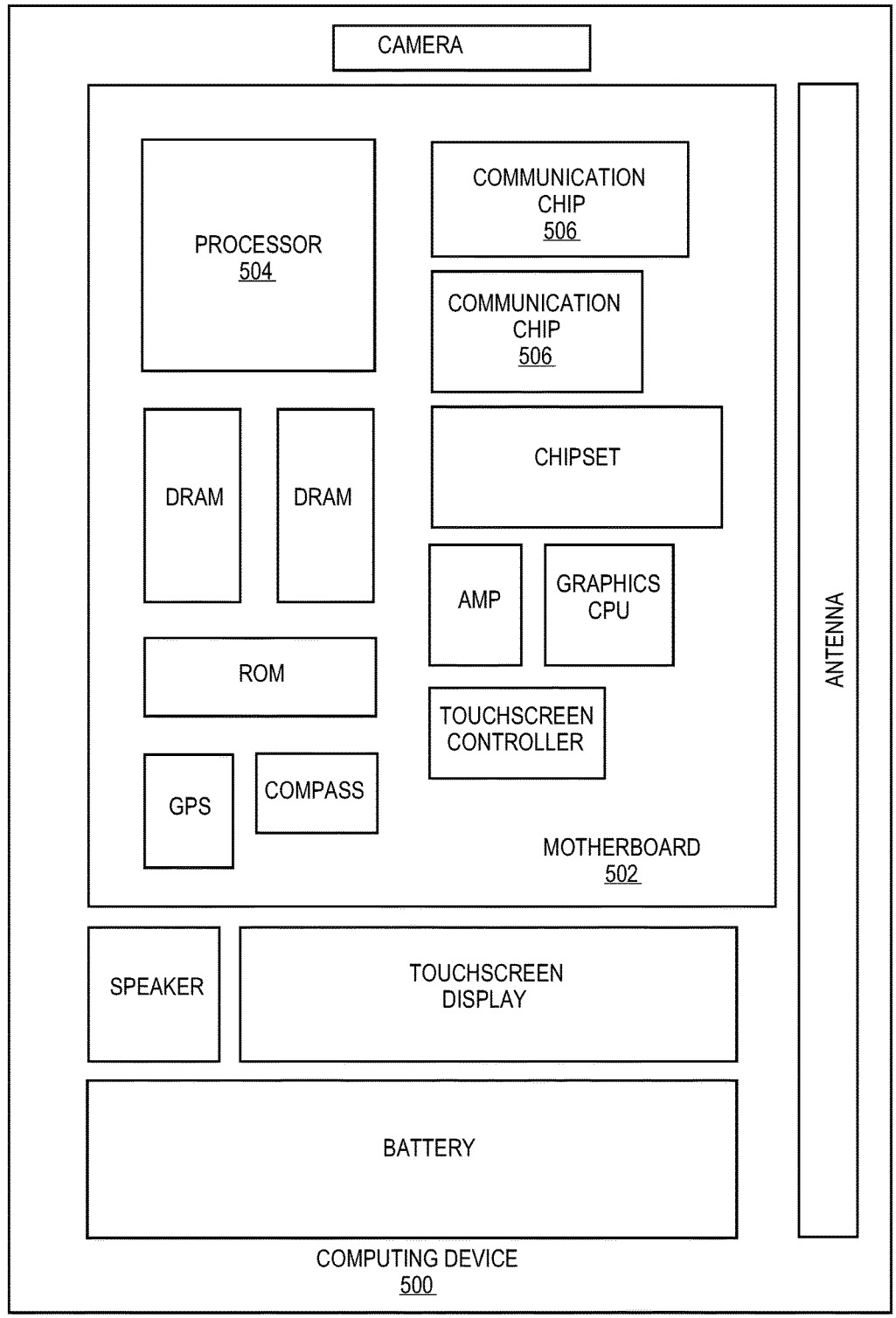
FIG. 17 illustrates an embodiment of a computing device.

FIG. 17 illustrates computing device 500 in accordance with one implementation. Computing device 500 houses board 502. Board 502 may include a number of components, including but not limited to processor 504 and at least one communication chip 506. Processor 504 is physically and electrically connected board 502. In some implementations the at least one communication chip 506 is also physically and electrically coupled to board 502. In further implementations, communication chip 506 is part of processor 504.

Depending on its applications, computing device 500 may include other components that may or may not be physically and electrically coupled to board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, first communication chip 506 may be dedicated to shorter range wireless communications such as Wi-Fi and Bluetooth and second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. In some implementations, the integrated circuit die of the processor includes one or more devices, such as a non-volatile memory (e.g., a STT-MRAM memory) built in accordance with implementations described herein. The term "processor" may refer to any device or portion of a device that processes electronic data from registers and/or memory to transform that electronic data into other electronic data that may be stored in registers and/or memory.

Communication chip 506 also includes an integrated circuit die packaged within communication chip 506. In accordance with another implementation of the invention, the integrated circuit die of the communication chip includes one or more devices, such as spin transfer torque memory built in accordance with implementations.

In further implementations, another component housed within computing device 500 may contain an integrated circuit die that includes one or more devices, such as non-volatile memory (e.g., STT-MRAM memory) built in accordance with implementations.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

Accordingly, one or more embodiments relate generally to the fabrication of microelectronic memory. The microelectronic memory may be non-volatile, wherein the memory can retain stored information even when not powered. One or more, embodiments of the present invention relate to the fabrication of a spin transfer torque memory element for non-volatile microelectronic memory devices. Such an element may be used in an embedded or standalone non-volatile memory, either for its non-volatility, or as a replacement for embedded and standalone dynamic random access memory (DRAM). For example, such an element may be used for 1T-1X memory (X=capacitor or resistor) at competitive cell sizes within a given technology node.

EXAMPLES

Example 1 is an apparatus including an array of memory cells arranged in a grid defined by word lines and bit lines in a generally orthogonal orientation relative to one another, a cell of the array of memory cells including a non-volatile memory component and an access transistor, wherein the access transistor includes a diffusion region including a portion that is disposed at an acute angle relative to an associated word line.

In Example 2, the non-volatile memory component in the apparatus of Example 1 is a STT-MRAM memory component.

In Example 3, the cell in the apparatus of Example 1 includes a pillar contact that is coupled to the resistive memory component and to the diffusion region of the access transistor.

In Example 4, the memory component in the apparatus of Example 3 is disposed between the bit line and a source line and the pillar contact is self aligned to the source line.

In Example 5, the source line in the apparatus of Example 4 is coupled to the diffusion region and a source line pitch is 2F.

In Example 6, the apparatus of Example 3 further includes a redistribution layer disposed between the memory component and the pillar contact and a relative position of the memory component and the pillar contact in the cell is offset or dissimilar.

In Example 7, the redistribution layer in the apparatus of Example 6 includes a surface having a reduced surface roughness relative to a surface of an end of the pillar contact.

In Example 8, the bit line pitch in the apparatus of Example 6 is 2F.

In Example 9, the memory component in the apparatus of Example 2 includes a magnetic tunnel junction.

Example 10 is a method including introducing a plurality of features on the substrate; conformally introducing a spacer material on the plurality of features, the spacer material having a thickness selected for a diffusion region of an access transistor; anisotropically etching the spacer material to expose the plurality of features; removing the plurality of features; etching the substrate to form a plurality of fins each including a body having a length dimension including a plurality of first junction regions and a plurality of second junction regions that are generally parallel to one another and offset by angled channel regions displacing in the length dimension an end of a first junction regions from the beginning of a second junction region; removing the spacer material; and introducing a gate electrode on the channel region of each of the plurality of fins, wherein the gate electrode is arranged in a generally orthogonal orientation relative to the plurality of first junction regions and the second junction regions.

In Example 11, each of the plurality of features introduced in the method of Example 10 includes a body having a length dimension including a plurality of first portions and a plurality of second portions that are generally parallel to one another and offset by angled portions displacing in the length dimension an end of a first portion from the beginning of a second portion.

In Example 12, the pitch between respective ones of the plurality of fins in the method of Example 10 is 2F.

In Example 13, the method of Example 10 further includes forming a plurality of source lines, each of the plurality of source lines arranged in a generally orthogonal orientation relative to the gate electrode; and forming a contact between ones of the plurality of first junction regions and the source line.

In Example 14, the method of Example 10 further includes forming a plurality of pillar contacts to respective ones of the plurality of second junction regions; forming a plurality of redistribution layers on respective ones of the plurality of pillar contacts, wherein ones of the plurality of pillar contacts contact a first side of ones of the plurality of redistribution layers; and forming a plurality of non-volatile memory components on the second side of respective ones of the plurality of redistribution layers, wherein respective ones of the redistribution layers offset an alignment of a pillar contact and a non-volatile memory component.

In Example 15, the plurality of pillar contacts in the method of Example 14 are self aligned to respective ones of the plurality of source lines.

In Example 16, the method of Example 14 further includes forming a plurality of bit lines wherein the plurality of non-volatile memory components are coupled to respective ones of the plurality of bit lines.

In Example 17, the pitch of adjacent non-volatile memory components along the bit line direction in the method of Example 16 is 3F.

In Example 18, prior to etching the substrate to form a plurality of fins, the method of Example 10 includes etching the spacer material with a spacer trim mask for separating spacer hard mask defining first and second junctions of access transistor at the dummy word line.

In Example 19, an integrated substrate of an array of memory cells having an effective size of $6F^2$ is formed by the method of any of Examples 10-18.

Example 20 is an apparatus including an integrated circuit substrate including an array of memory cells having an effective size of $6F^2$, the array arranged in a grid defined by word lines and bit lines arranged in a generally orthogonal orientation relative to one another, a cell of the array of memory cells including a non-volatile memory component and an access transistor, wherein the access transistor includes a channel region that is disposed at an acute angle relative to an associated word line and a first junction region coupled to a source line and a second junction region coupled to a bit line through non-volatile memory component.

In Example 21, the non-volatile memory component in the apparatus of Example 20 is an STT-MRAM memory component.

In Example 22, the resistive memory component in the apparatus of Example 20 is coupled to the bit line and each cell further includes a pillar contact that couples the memory component to the second junction region of the access transistor.

In Example 23, in the cell, the memory component in the apparatus of Example 22 is disposed between a bit line and a source line and the pillar contact is self aligned to the source line.

In Example 24, the apparatus of Example 23 further includes a redistribution layer disposed between the memory component and the pillar contact and a relative position of the memory component and the pillar contact in the cell is dissimilar.

In Example 25, the memory component in the apparatus of any of Examples 20-24 includes a magnetic tunnel junction.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
an array of memory cells arranged in a grid defined by word lines and bit lines in a generally orthogonal orientation relative to one another, a cell of the array of memory cells comprising a non-volatile memory component and an access transistor, wherein the access transistor comprises a diffusion region wherein a portion of the diffusion region is disposed at an acute angle relative to an associated word line, the cell further comprising a pillar contact that is coupled to the memory component and to the diffusion region of the access transistor, and a redistribution layer disposed between the memory component and the pillar contact wherein a relative position of the memory component and the pillar contact in the cell is offset.

2. The apparatus of claim 1, wherein the non-volatile memory component is an STT-MRAM memory component.

3. The apparatus of claim 1, wherein the memory component is disposed between the bit line and a source line and the pillar contact is self aligned to the source line.

4. The apparatus of claim 3, wherein the source line is coupled to the diffusion region and a source line pitch is 2F.

5. The apparatus of claim 1, wherein the redistribution layer comprises a surface having a reduced surface roughness relative to a surface of an end of the pillar contact.

6. The apparatus of claim 1, wherein a bit line pitch is 2F.

7. The apparatus of claim 2, wherein the memory component comprises a magnetic tunnel junction.

8. A method comprising:
introducing a plurality of features on the substrate;
conformally introducing a spacer material on the plurality of features, the spacer material having a thickness selected for a junction region of an access transistor;
anisotropically etching the spacer material to expose the plurality of features;
removing the plurality of features;
etching the substrate to form a plurality of fins each comprising a body having a length dimension comprising a plurality of first junction regions and a plurality of second junction regions that are generally parallel to one another and offset by angled channel regions displacing in the length dimension an end of a first junction regions from the beginning of a second junction region;
removing the spacer material; and
introducing a gate electrode on the channel region of each of the plurality of fins, wherein the gate electrode is arranged in a generally orthogonal orientation relative to the plurality of first junction regions and the second junction regions.

9. The method of claim 8, wherein each of the plurality of features introduced comprises a body having a length dimension comprising a plurality of first portions and a plurality of second portions that are generally parallel to one another and offset by angled portions displacing in the length dimension an end of a first portion from the beginning of a second portion.

10. The method of claim 8, wherein a pitch between respective ones of the plurality of fins is 2F.

11. The method of claim 8, further comprising:
forming a plurality of source lines, each of the plurality of source lines arranged in a generally orthogonal orientation relative to the gate electrode; and
forming a contact between ones of the plurality of first junction regions and the source line.

12. The method of claim 8, further comprising:
forming a plurality of pillar contacts to respective ones of the plurality of second junction regions;
forming a plurality of redistribution layers on respective ones of the plurality of pillar contacts, wherein ones of the plurality of pillar contacts contact a first side of ones of the plurality of redistribution layers; and
forming a plurality of non-volatile memory components on the second side of respective ones of the plurality of redistribution layers, wherein respective ones of the redistribution layers offset an alignment of a pillar contact and a non-volatile memory component.

13. The method of claim 12, wherein the plurality of pillar contacts are self aligned to a respective ones of the plurality of source lines.

14. The method of claim 12, further comprising forming a plurality of bit lines wherein the plurality of non-volatile memory components are coupled to respective ones of the plurality of bit lines.

15. The method of claim 14, wherein a pitch of adjacent non-volatile memory components along the bit line direction is 3F.

16. The method of claim 8, wherein prior to etching the substrate to form a plurality of fins, the method comprises etching the spacer material with a spacer trim mask for separating spacer hard mask defining first and second junctions of access transistor at the dummy word line.

17. An integrated substrate of an array of memory cells having an effective size of $6F^2$ formed by the method of claim 8.

18. An apparatus comprising:
an integrated circuit substrate comprising an array of memory cells having an effective size of $6F^2$, the array arranged in a grid defined by word lines and bit lines arranged in a generally orthogonal orientation relative to one another, a cell of the array of memory cells comprising a non-volatile memory component and an access transistor, wherein the access transistor comprises a channel region that is disposed at an acute angle relative to an associated word line and a first junction region coupled to a source line and a second junction region coupled to a bit line, wherein the memory component is coupled to the bit line and the cell further comprises a pillar contact that couples the memory component to the second junction region of the access transistor and a redistribution layer disposed between the resistive memory component and the pillar contact and a relative position of the memory component wherein the pillar contact in the cell is dissimilar.

19. The apparatus of claim 18, wherein the non-volatile memory component is a STT-MRAM memory component.

20. The apparatus of claim 18, wherein in the cell, the memory component is disposed between a bit line and a source line and the pillar contact is self aligned to the source line.

21. The apparatus of claim 18, wherein the memory component comprises a magnetic tunnel junction.

* * * * *